(12) United States Patent
Hellberg

(10) Patent No.: US 6,639,464 B2
(45) Date of Patent: Oct. 28, 2003

(54) COMPOSITE AMPLIFIER

(75) Inventor: Richard Hellberg, Huddinge (SE)

(73) Assignee: Lefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/310,064

(22) Filed: Dec. 5, 2002

(65) Prior Publication Data

US 2003/0076166 A1 Apr. 24, 2003

Related U.S. Application Data

(63) Continuation of application No. PCT/SE01/01201, filed on May 30, 2001.

(51) Int. Cl.⁷ .................................................. H03F 3/68
(52) U.S. Cl. ................................. 330/124 R; 330/144
(58) Field of Search ............................... 330/51, 124 R, 330/144, 295, 84

(56) References Cited

U.S. PATENT DOCUMENTS

| | | |
|---|---|---|
| 5,017,888 A | 5/1991 | Meinzer |
| 5,739,723 A | 4/1998 | Sigmon et al. |
| 5,757,229 A | 5/1998 | Mitzlaff |
| 5,880,633 A | 3/1999 | Leizerovich et al. |
| 6,262,629 B1 * | 7/2001 | Stengel et al. .......... 330/124 R |
| 6,396,341 B1 * | 5/2002 | Pehlke .................... 330/10 |

* cited by examiner

Primary Examiner—Henry Choe
(74) Attorney, Agent, or Firm—Nixon & Vanderhye, P.C.

(57) ABSTRACT

A composite amplifier includes a main power amplifier (10) and an auxiliary power amplifier (12), which are connected to a load (26) over a Doherty output network. An attenuator (34) is provided for activating the auxiliary power amplifier (12) before the main amplifier (10) is saturated. Preferably the input drive voltage to the auxiliary power amplifier (12) is increased along a smooth curve as the input signal amplitude to the composite amplifier increases.

10 Claims, 7 Drawing Sheets

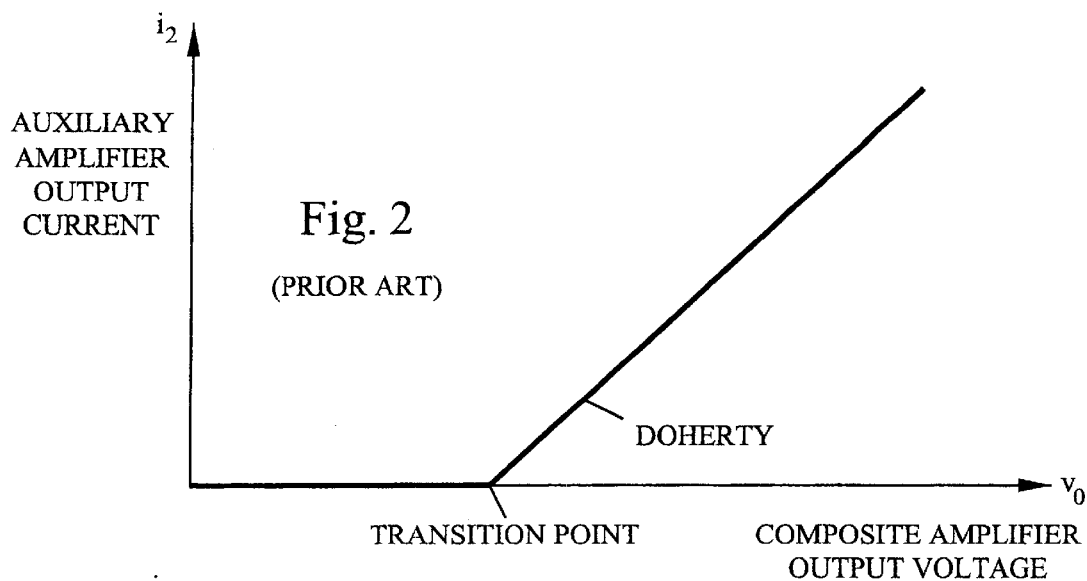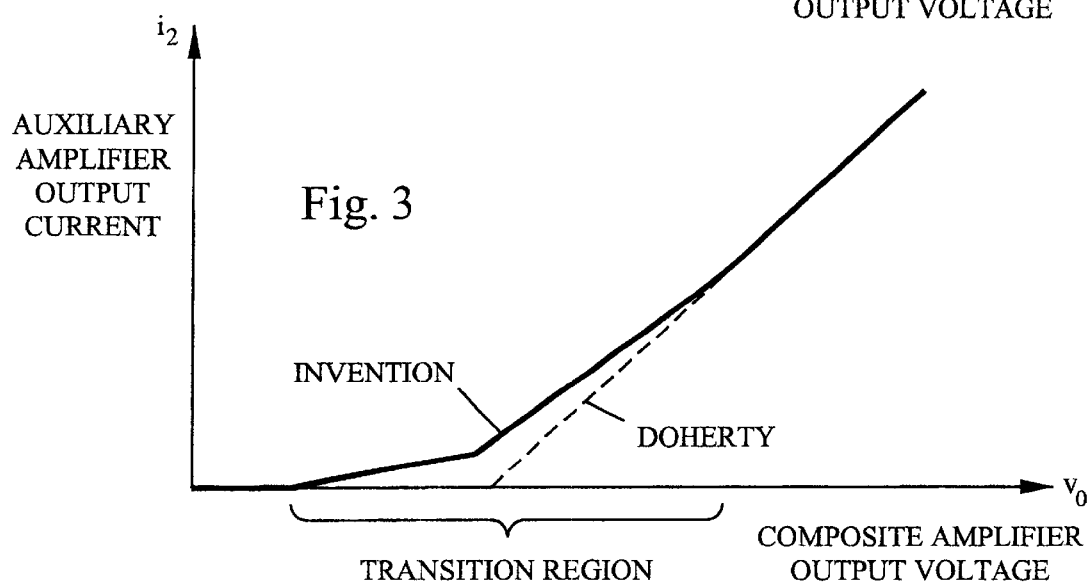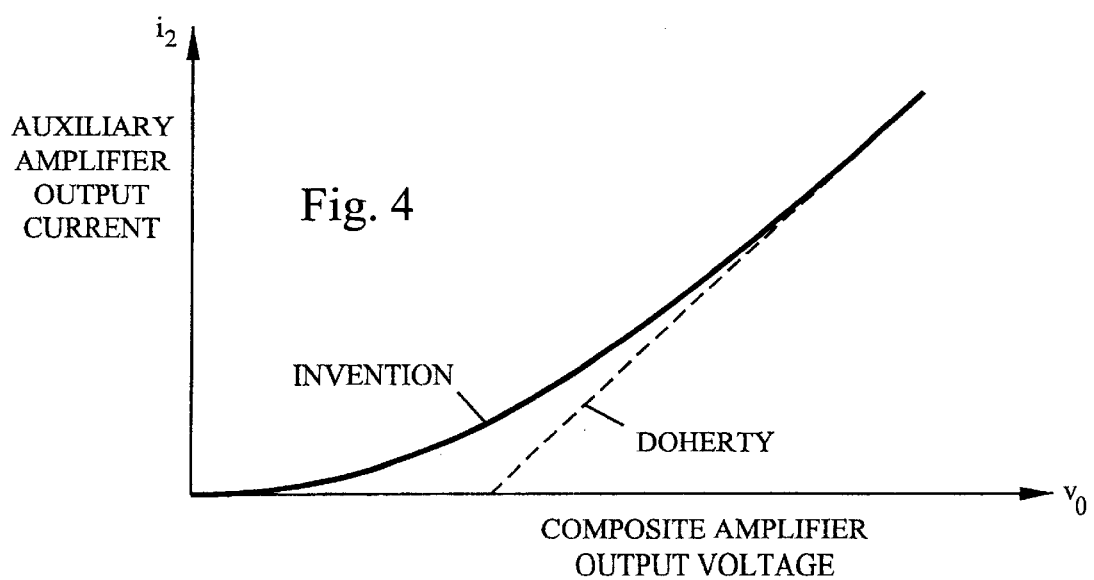

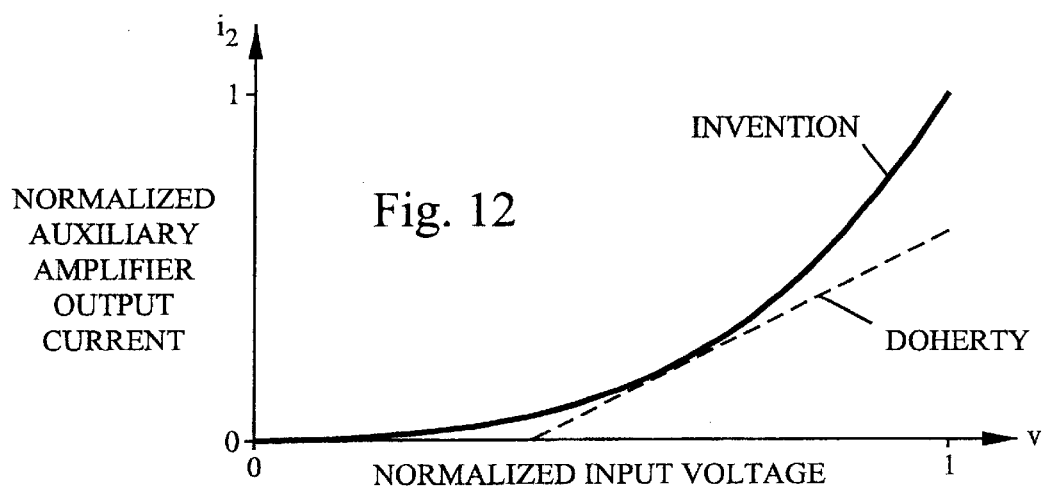
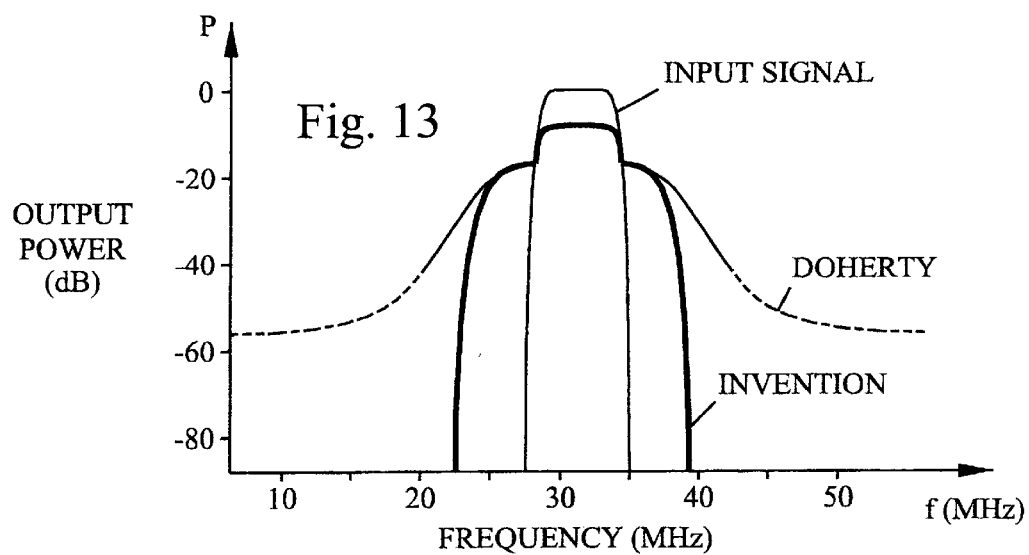
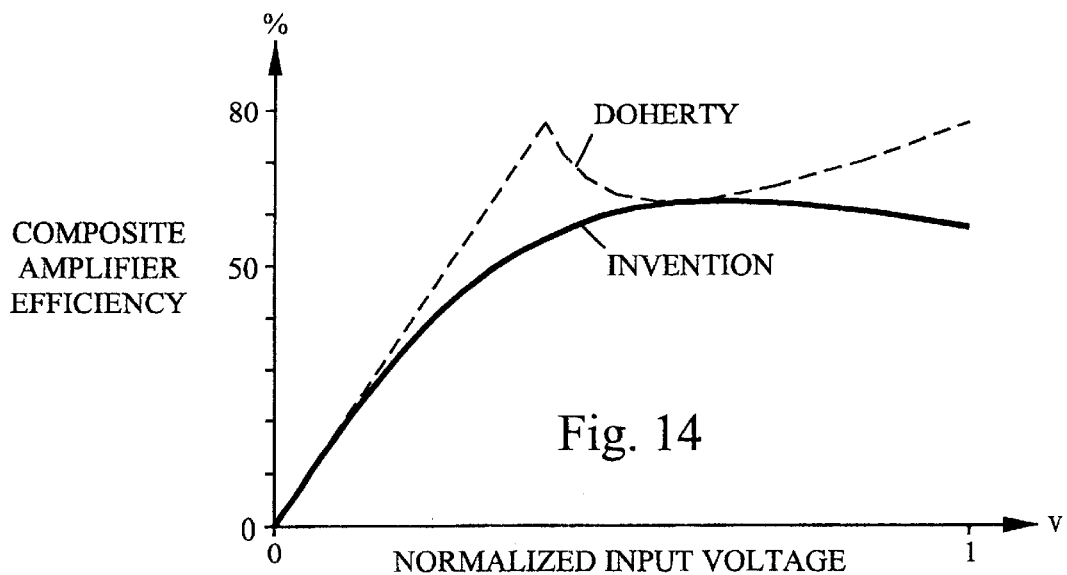

COMPOSITE AMPLIFIER

This application is the continuation of international application PCT/SE01/01201 filed May 30, 2001, which designated the US, the entire contents of which are incorporated herein by this reference.

TECHNICAL FIELD

The present invention relates to a composite amplifier of the type that includes a main power amplifier and an auxiliary power amplifier, which are connected to a load over a Doherty output network.

BACKGROUND

In cellular base stations, satellite communications and other communications and broadcast systems, many radio frequency (RF) carriers, spread over a large bandwidth, are amplified simultaneously in the same high power amplifier (HPA alt. PA). For the power amplifier this has the effect that the instantaneous transmit power will vary very widely and very rapidly. This is because the sum of many independent RF carriers (a multi-carrier signal) tends to have a large peak-to-average power ratio. It also tends to have an amplitude distribution similar to single-sideband band-limited Gaussian noise, which has a Rayleigh distribution.

The main difficulties in a PA are efficiency and linearity. A conventional class-B power amplifier has an efficiency proportional to the output amplitude and exhibits maximum DC to RF power conversion efficiency when it delivers its peak power to the load. Since the quasi-Rayleigh distribution of amplitudes in the summed transmit signal has a large difference between the average power and the peak power, the overall efficiency when amplifying such a signal in a conventional class-B amplifier is very low. For a quasi-Rayleigh distributed signal with a 10-dB peak-to-average power ratio, the efficiency of an ideal class-B amplifier is only 28%, see [1].

The linearity of an RF power amplifier is usually characterized by its AM-AM (AM=amplitude modulation) and AM-PM (PM=phase modulation) distortion characteristics. Non-linearities manifest themselves as cross-mixing of different parts of the signal, leading to leakage of signal energy into undesired channels. By restricting the signal to be transmitted to a smaller part of the total voltage swing, the linearity can be increased. However, this reduces the efficiency of the amplifier even further. The linearity of a power amplifier is also reduced greatly if the amplifier saturates (the output voltage is clipped). This lessens the chance of increasing efficiency by driving the amplifier into saturation, since the distortion would then reach unacceptable levels.

A method for increasing the efficiency of an RF power amplifier is described in [1]. This amplifier, called a Doherty amplifier, uses in its basic form a main amplifier (also called carrier amplifier) and an auxiliary amplifier (also called peaking amplifier). The load is connected to the auxiliary amplifier, and the main amplifier is connected to the load through an impedance inverter, usually a quarter-wavelength transmission line or an equivalent lumped network.

At low output levels only the main amplifier is active. When the output level climbs over the so-called transition point (usually at half the maximum output voltage), the auxiliary amplifier becomes active driving current into the load, and through the impedance inverting action of the quarter-wavelength transmission line, decreases the effective impedance at the output of the main amplifier, to keep the main amplifier at a constant (peak) voltage. This is called negative load-pulling, and means that for the levels above the transition point, the main amplifier operates at maximum efficiency. At the same time, the auxiliary amplifier sees an increasing load, which is called positive load-pulling. The result is an approximately linear output power to input power relationship, but with a higher efficiency than a traditional amplifier.

Below the transition point, the auxiliary amplifier is shut off, and the main amplifier sees a higher (usually two times higher) load impedance than the impedance at peak power, which increases (doubles) its efficiency in this region also. The power lost in the auxiliary amplifier decreases the total efficiency slightly at levels above the transition point, but this action is small and negligible compared to the efficiency gained by using this technique.

The transition point can also be shifted, so that the auxiliary amplifier kicks in at a lower or higher power level. The power efficiency for an ideal Doherty amplifier, whose transition point is optimized for a quasi-Rayleigh distributed signal with a 10-dB peak-to-average power ratio, is increased to 60%, which is very high compared to the efficiency of an ideal class-B amplifier (28%), see [1].

Several patents have been granted for Doherty amplifiers, usually with small differences from what is described in [1], for example [2, 3, 4, 5]. The Doherty concept has also been extended to multi-stage variants [1, 4, 5]. This allows the efficiency to be kept higher over a broader range of output power levels.

A common feature of the prior art Doherty amplifiers described in [1, 2, 3, 4, 5] and also in [6, chapter 8, pp. 225–239] is that they all have the auxiliary amplifiers completely shut off below the transition point(s).

Due to mismatches between the phases and impedances of the amplifiers and due to nonlinear capacitances and resistances, distortion is generated at the transition point. The main amplifier is also expected to go into saturation [1], which changes a lot of characteristics of the amplifier. Saturation is generally known as a point where a lot of distortion is generated [6, chapter 7, pp. 179–218].

The main difference between the distortion effects in a Doherty amplifier and those encountered in a traditional power amplifier, such as a class-B, AB, or A, is that they occur right inside the range of power levels that are most often encountered. This is evident by looking at FIG. 9 of [2], in which the intermodulation distortion starts to rise very sharply at a point about 6 dB down from peak power. For traditional power amplifiers, most distortion is generated in the peak-power end, which is much less occupied for multi-carrier signals. The statement is even more true for the optimized Doherty amplifier, where the transition point is moved closer to the maximum of the Rayleigh distribution.

The distortion that is generated at the transition point is also of high order, that is, when described by a distortion polynomial, a polynomial with many coefficients (and hence powers of the voltage) is needed to describe it. This implies that if we want to correct for this distortion by applying an inverse function at the input of the amplifier, so called pre-distortion, a high order is needed also for the pre-distortion. This means that the bandwidth of the pre-distorter must be very large, which is a great problem if digital processing is used for the pre-distorter. It is also a problem to keep a constant gain and phase through the whole up-converter chain, over the entire used bandwidth, if the bandwidth is very large.

The wide bandwidth of the output from the auxiliary amplifier is also a problem in itself, since stringent phase and impedance matching conditions must be met, over the whole used bandwidth, between the main and auxiliary amplifier. The impedance inverter is by nature a narrowband device, but the bandwidth of the output signal of the auxiliary amplifier is very large. The auxiliary amplifier signal components outside of the impedance inverter optimum will not have the correct phase and amplitude at the output of the carrier amplifier, which causes distortion.

The conclusion is that the distortion in a Doherty amplifier is more severe, and that it is harder to correct for this distortion, than in a traditional RF power amplifier.

SUMMARY

An object of the present invention is to provide a new composite amplifier which retains most of the efficiency and also most of the simplicity of the Doherty amplifier concept, while achieving greater linearity and easier cooperation with linearity-enhancement techniques.

This object is achieved in accordance with the attached claims.

Briefly, the present invention changes the abrupt characteristic of the Doherty auxiliary amplifier attenuation function into a smooth, low-order characteristic with an extended (possibly all the way from zero to peak power) soft transition region.

Amplifiers in accordance with the present invention have a lower distortion, better cooperation with linearization equipment and narrower bandwidth of the signals in the impedance inverter than the prior art Doherty amplifier. At the same time, most of the efficiency of the Doherty amplifier can be retained.

BRIEF DESCRIPTION OF THE DRAWINGS

The invention, together with further objects and advantages thereof, may best be understood by making reference to the following description taken together with the accompanying drawings, in which:

FIG. 2 is a diagram illustrating the relationship between output voltage and auxiliary amplifier output current in a prior art Doherty amplifier;

FIG. 3 is a diagram illustrating the relationship between output voltage and auxiliary amplifier output current in a first embodiment of a composite amplifier in accordance with the present invention;

FIG. 4 is a diagram illustrating the relationship between output voltage and auxiliary amplifier output current in a second embodiment of a composite amplifier in accordance with the present invention;

FIG. 12 is a diagram illustrating another exemplary current function for the auxiliary amplifier in a composite amplifier in accordance with the present invention;

FIG. 13 is a diagram illustrating the current spectrum that corresponds to the current function in FIG. 12; and FIG. 14 is a diagram illustrating the efficiency of an ideal composite amplifier in accordance with the present invention having the auxiliary amplifier current function of FIG. 12.

DETAILED DESCRIPTION

Figure 1:
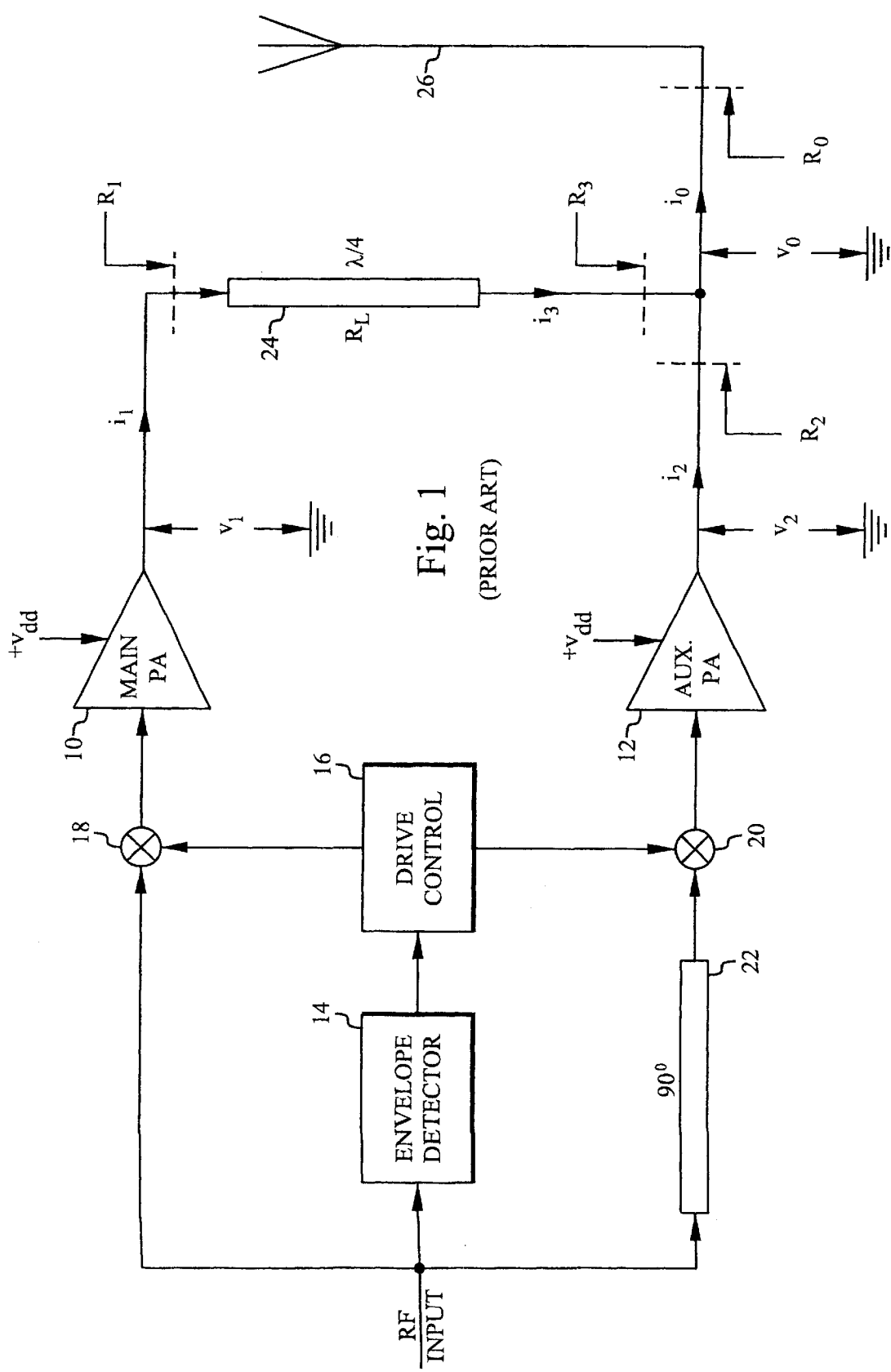
FIG. 1 is a simplified block diagram of a prior art Doherty amplifier.

FIG. 1 is a simplified block diagram of a prior art Doherty amplifier. The input signals to a main power amplifier 10 and an auxiliary power amplifier 12 are generated from a radio frequency (RF) input signal over an envelope detector 14 connected to a drive control unit 16. Drive control signals multiply the RF input signal in multipliers 18 and 20, respectively, before it is forwarded to amplifiers 10 and 12. The input signal to auxiliary power amplifier 12 is also phase shifted 90° in a phase shifter 22.

On the output side the amplifiers are inter-connected by a Doherty network formed by an impedance inverter 24, for example a quarter-wavelength transmission line or an equivalent lumped network. The output of auxiliary power amplifier 12 is connected directly to the load (antenna) 26, whereas the output of main power amplifier 10 is connected to the load over impedance inverter 24.

In the Doherty amplifier, auxiliary power amplifier 12 is turned off at power levels below a transition point, at which main power amplifier 10 goes into saturation, and turned on above the transition point, as illustrated in FIG. 2. The condition that amplifier 10 is saturated above the transition point is in the prior art (for example represented by [1]) said to be part of the function of the Doherty amplifier, and may wrongly lead to the conclusion that main power amplifier 10 must go into saturation (to effectively become a voltage source) before auxiliary power amplifier 12 is turned on. However, this is in fact not necessary, as will be shown below.

Contrary to [1], the inverted load-pulling effect obtained by connecting the two amplifiers via an impedance inverter works equally well at all output levels. This can be verified by observing the relationships between the voltages and currents in the system. Both amplifiers are assumed turned on but not in saturation, working as ideal controlled RF current sources, generating the currents $i_1$ and $i_2$. The power ratio between amplifiers 10 and 12 at peak output power is $\alpha$, with main power amplifier 10 providing $\alpha$ and auxiliary power amplifier 12 providing $1-\alpha$ of the total peak output power.

The impedance $R_L$ of quarter-wavelength transmission line 24 is $R_0/\alpha$, if the supply voltages $v_{dd}$ to both amplifiers are equal.

Observing that the same power must both go into and exit from a lossless transmission line, we have that:

$$i_3 \cdot v_0 = i_1 \cdot v_1$$

Impedance inverter 24 transforms voltages to currents and currents to voltages, so that:

$$i_3 = \frac{v_1}{R_L}$$

$$v_0 = i_1 \cdot R_L^2$$

The impedances are also transformed by the relation:

$$R_1 \cdot R_3 = R_L^2$$

Since the output voltage $v_0$ is governed solely by the value of $i_1$, the only parameters that can change if $i_2$ is changed (and all other things are kept constant) is the voltage $v_1$ and the related current $i_3$. Since:

$$i_0 = i_2 + i_3$$

an increase in $i_2$ must be accompanied by an equal decrease in $i_3$ to keep $i_0$ constant. The current $i_0$ is in turn only dependent upon $v_0$, which was generated by $i_1$. Therefore, the controlled current $i_1$ single-handedly controls the output power, and $i_2$ determines the ratio of current between $i_2$ and $i_3$, and hence the ratio of power delivered by main power amplifier 10 to that delivered by auxiliary power amplifier 12.

The power $P_1$ delivered by main power amplifier 10 is:

$$P_1 = i_1 \cdot v_1$$

The power $P_2$ delivered by auxiliary power amplifier 12 is:

$$P_2 = i_2 \cdot v_0$$

Since $P_1$ can be rewritten as:

$$P_1 = i_3 \cdot v_0$$

the sum of $P_1$ and $P_2$ becomes:

$$P_1 + P_2 = (i_2 + i_3) v_0$$

Since $$i_0 = i_2 + i_3$$

this equals the total output power:

$$P_1 + P_2 = i_0 \cdot v_0$$

(The power is ½·$i_0$·$v_0$, if $i_0$ and $v_0$ are referring to peak values of current and voltage, since the waveforms are sinusoidal.)

The result of the above calculation is that it is in fact possible to choose $i_2$ much more freely than in the classical Doherty amplifier, and that saturation of either amplifier is not necessary.

A possible improvement is to extend the transition point into a broader range, with main power amplifier 10 going much more smoothly into saturation, or not going into saturation at all. At the same time, auxiliary power amplifier 12 can start to contribute power more softly than the sudden onset at the transition point. This is achieved by modifying the current $i_2$ as a function of the output voltage $v_0$ (or equivalently current $i_1$). A simple example is shown in FIG. 3, where the transition point has been extended into a transition region. The effect of this is that the high-order distortion at the transition point is "smeared out" over a wider range, making it more low-order. The decreased bandwidth of this distortion means that it will be easier to use pre-distortion to cancel it.

The current function $i_2$ may be obtained by multiplying the RF signal with an attenuation function. This attenuation function should ideally only affect the magnitude of the signal and not the phase, i.e. it should be a real function. However, if some sort of pre-distortion of the AM-PM distortion of auxiliary power amplifier 12 is included, it could as one possibility be included in this attenuation function.

The negative effect of the modified current function is that the efficiency of the composite amplifier in accordance with the present invention compared to the Doherty amplifier is somewhat reduced for the parts of the curve where $i_2$ is larger than the corresponding $i_2$ of the Doherty amplifier. This is because the output voltage $v_1$ of main power amplifier 10 has been reduced somewhat compared that of the Doherty amplifier, and also because the auxiliary amplifier is contributing more loss.

A further improvement is to make the current function itself a lower order function, for example as illustrated in FIG. 4. This is achieved by using an attenuation function, that is essentially based on a low-order polynomial, for modifying the input to auxiliary power amplifier 12. This function can also be stored in a look-up table, the essential quality being that it is free of significant higher order features.

The benefit of having a low-order current function for the auxiliary amplifier is that the signal bandwidth of the auxiliary amplifier will be much narrower. This means that the signal processing devices, filters, mixers and amplifiers in the up-converter chain can have a significantly reduced bandwidth compared to a Doherty implementation. Since the impedance inverter is a narrowband device, the reduction of the bandwidth of the signals that are transformed in this device implies a better phase and amplitude matching between the amplifiers. This will reduce losses. Since the extra bandwidth necessary for the composite amplifier in accordance with this embodiment is much lower, it is possible to increase the useful signal bandwidth instead.

In general, the current function should have the following properties:

(a) a non-zero auxiliary amplifier output current $i_2$ below the main amplifier saturation point; and (b) a lower slope for non-zero low auxiliary amplifier output currents than for high auxiliary amplifier output currents.

The signal to the auxiliary amplifier can be generated in the digital domain, in the analog domain, at baseband, at an intermediate frequency (IF) or at RF. It is preferably generated as the product of the signal and an attenuation function. This multiplication can be performed anywhere from baseband to RF. At RF it is preferably done by the use of the attenuation function in an analog multiplier. In some cases a multiplying digital-to-analog converter (DAC) can be used. The arrangements that are the easiest to implement are when the multiplication is performed at RF, since no separate up-conversion chain is needed for the auxiliary amplifier.

Figure 5:
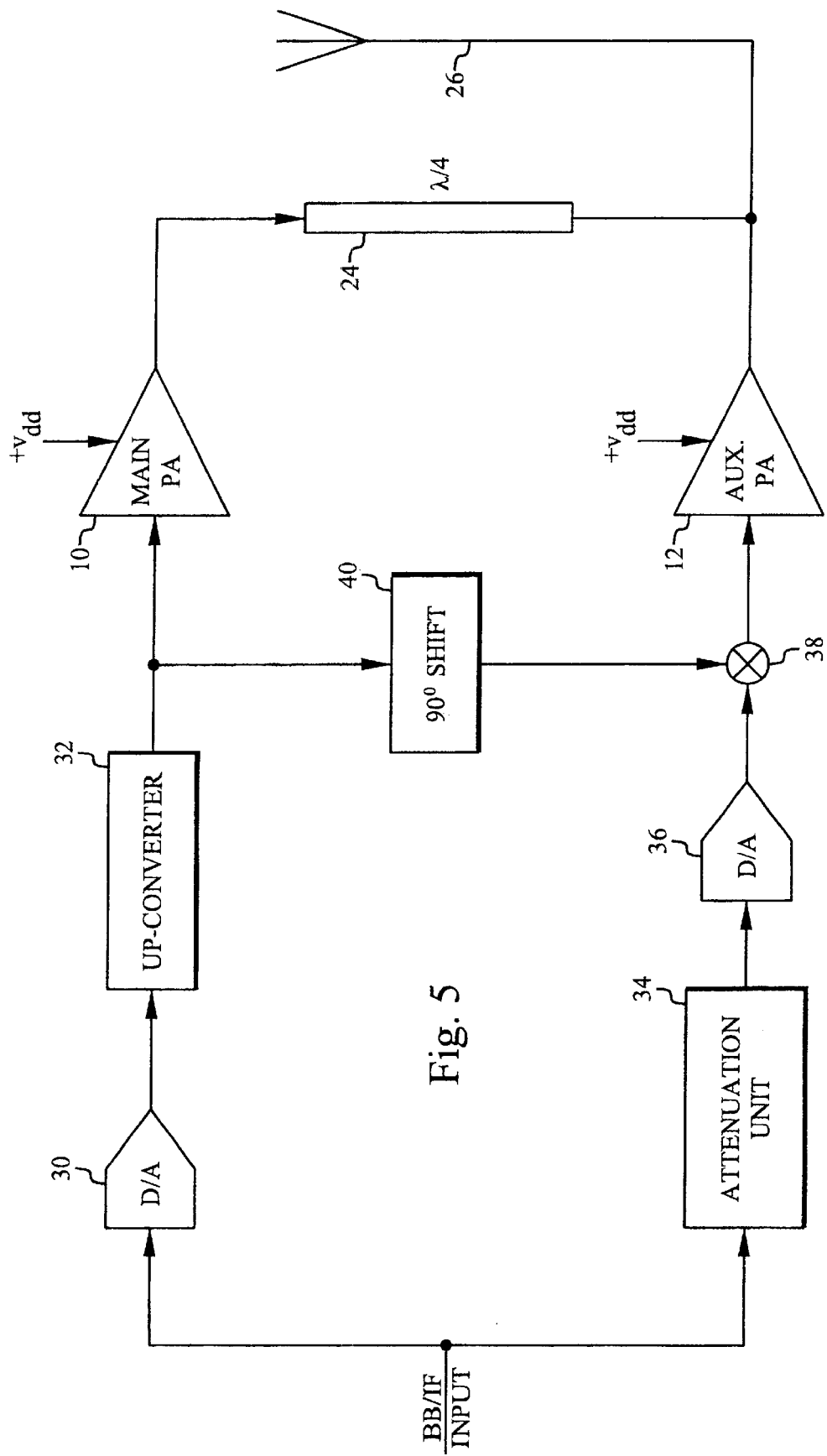
FIG. 5 is a block diagram of an exemplary embodiment of a composite amplifier in accordance with the present invention.

FIG. 5 is a block diagram of an exemplary embodiment of a composite amplifier in accordance with the present invention. The output side includes a Doherty output network of the same type as in the classical Doherty amplifier in FIG. 1. On the input side a base-band or IF digital signal is forwarded to a D/A converter 30. The analog signal is forwarded to an up-converter 32, which converts the signal to RF. The RF signal is forwarded to main power amplifier 10. The digital input signal is also forwarded to an attenuation unit 34, for example a look-up table, that attenuates the input signal in order to achieve the characteristic in FIG. 3 or 4. The attenuated signal is forwarded to a D/A converter 36. The analog signal from D/A converter 36 is forwarded to a multiplier 38, which multiplies it by a version of the input signal to main power amplifier 10 that has been shifted 90 degrees in a phase shifter 40. The multiplied signal is forwarded to auxiliary power amplifier 12. The 90 degree phase shift for auxiliary power amplifier 12 is to ensure that the main and auxiliary amplifiers are phase-aligned at the output.

Figure 6:
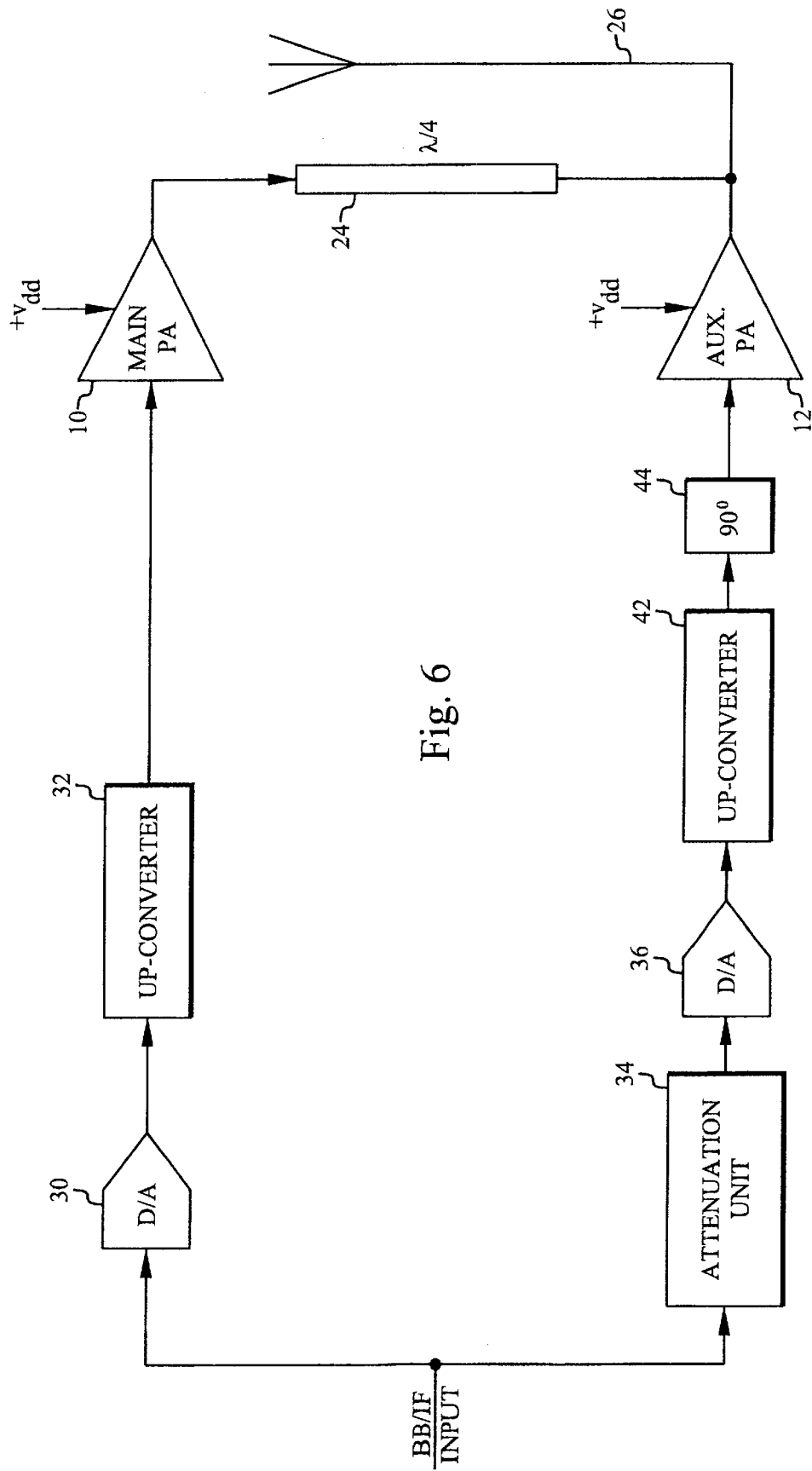
FIG. 6 is a block diagram of another exemplary embodiment of a composite amplifier in accordance with the present invention.

FIG. 6 is a block diagram of another exemplary embodiment of a composite amplifier in accordance with the present invention. This embodiment differs from the embodiment of FIG. 5 in that a separate up-converter 42 is used for auxiliary power amplifier 12, and in that a phase shifter 44 is provided after this up-converter.

As an example of the present invention, consider an amplifier with the power division ratio $\alpha=0.36$. This is the optimal value (for efficiency) for a Doherty amplifier with a quasi-Rayleigh distributed signal having a 10 dB peak-to-average power ratio [1]. An amplifier in accordance with the present invention uses a soft attenuation function (in attenuation unit 34) illustrated in FIG. 7 for generating $i_2$. Since $i_2$ will have a current function similar to FIG. 4, the result is that auxiliary power amplifier 12 is never completely shut off.

Figure 7:
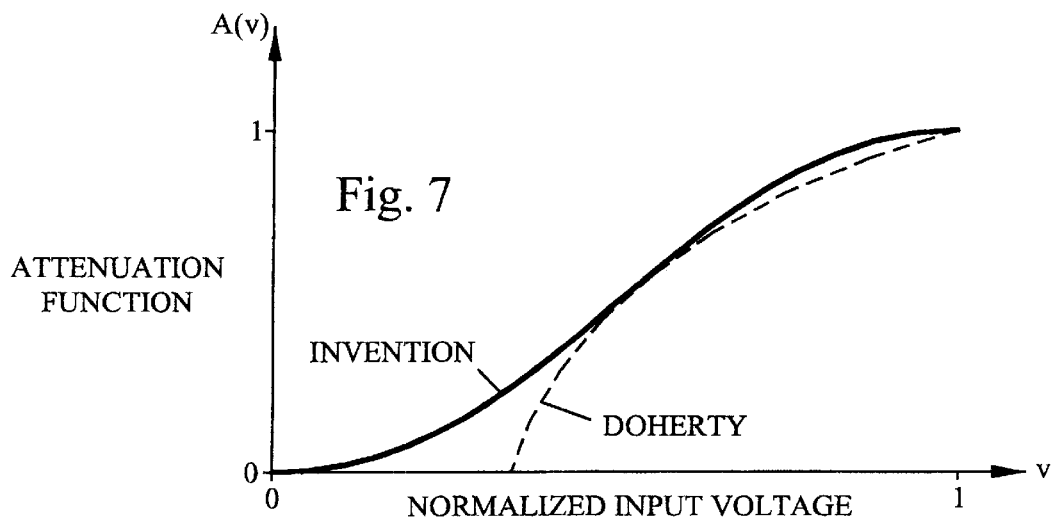
FIG. 7 is a diagram illustrating an exemplary attenuation function for the auxiliary amplifier in a composite amplifier in accordance with the present invention.
Figure 8:
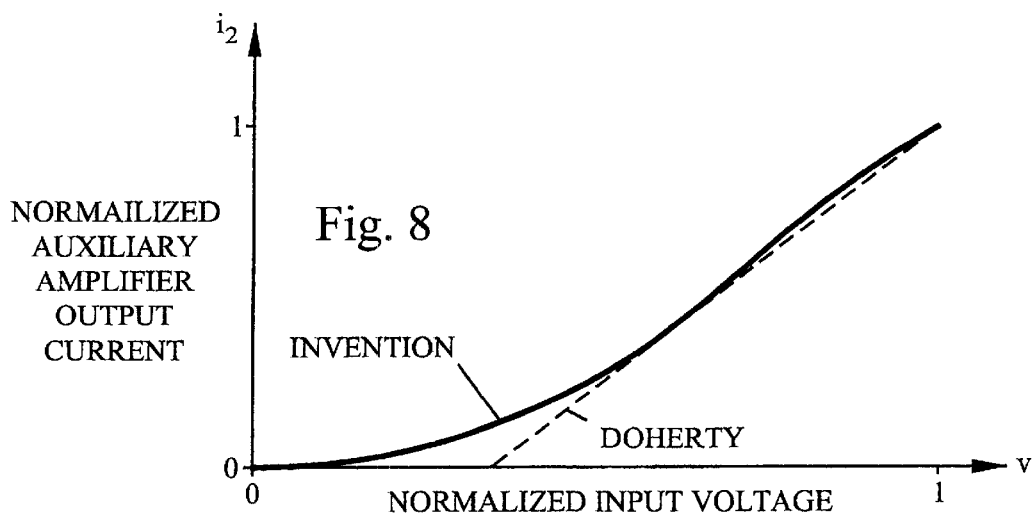
FIG. 8 is diagram illustrating the current function that corresponds to the attenuation function in FIG. 7.

The attenuation function typically is a low order polynomial of the input signal, preferably a polynomial in power (i.e. it contains only powers of squared signal magnitude). An example is:

$$A(v)=2.151\cdot|v|^2-1.151\cdot|v|^4$$

where v is the normalized input signal amplitude. This attenuation function is illustrated in FIG. 7. The attenuation function leads to the current function:

$$i_2(v)=A(v)\cdot v$$

which is illustrated in FIG. 8 ($i_2$ is also normalized).

Figure 9:
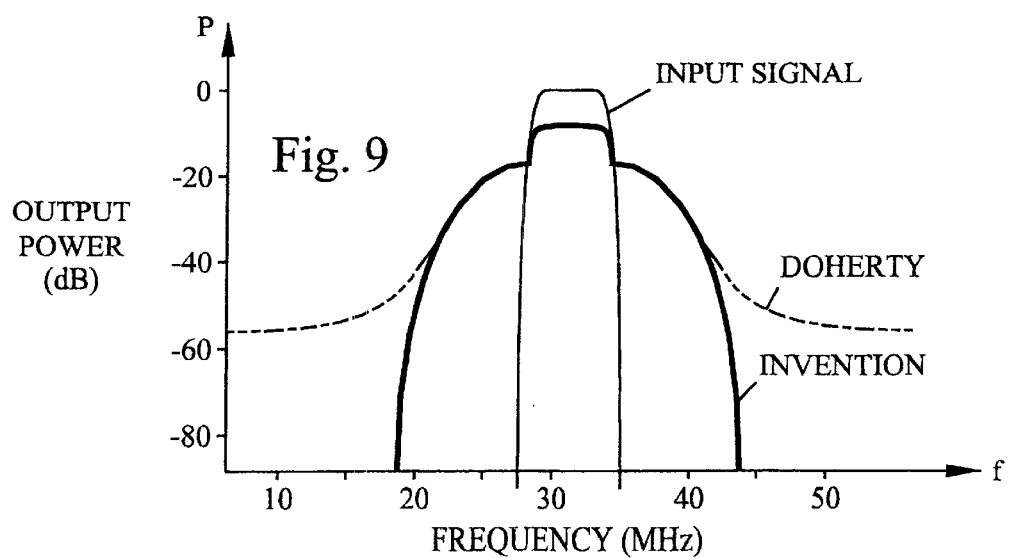
FIG. 9 is a diagram illustrating the current spectrum that corresponds to the attenuation function in FIG. 7.

The qualitative behavior of the spectra of the current functions for the auxiliary amplifiers in the composite amplifier of the present invention and in the Doherty amplifier are shown in FIG. 9. It is noted that the auxiliary amplifier current spectrum for the composite amplifier of the present invention is much narrower than for the Doherty amplifier. The spectrum of the input signal is also included for reference.

Figure 10:
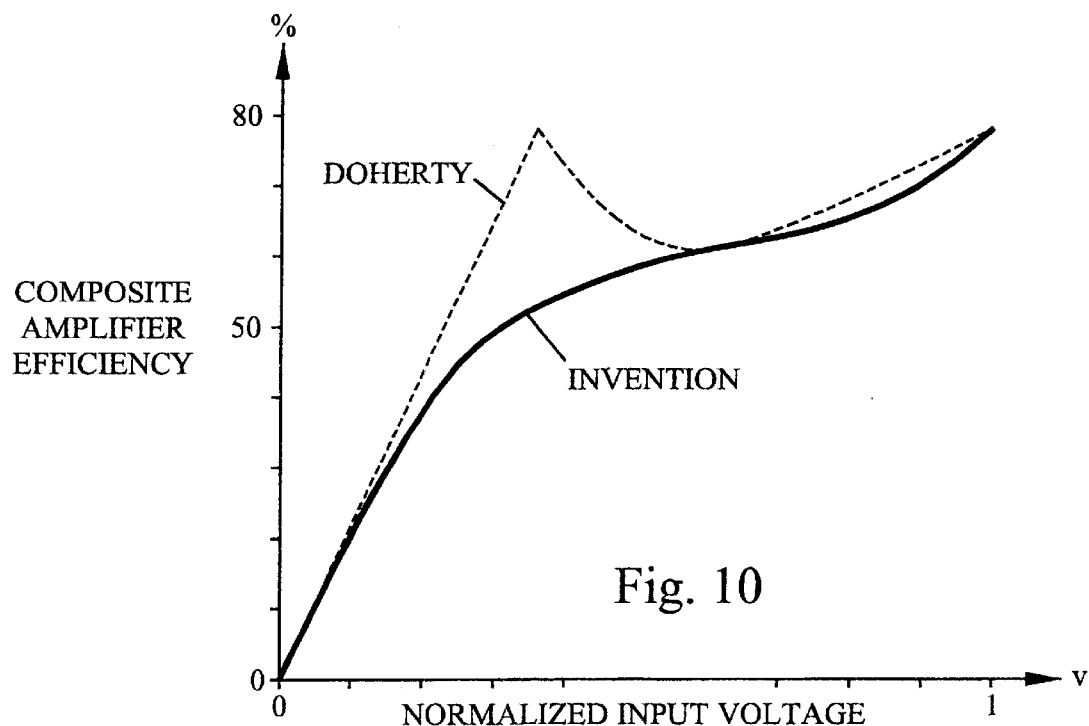
FIG. 10 is a diagram illustrating the efficiency of an ideal composite amplifier in accordance with the present invention having the auxiliary amplifier attenuation function of FIG. 7.
Figure 11:
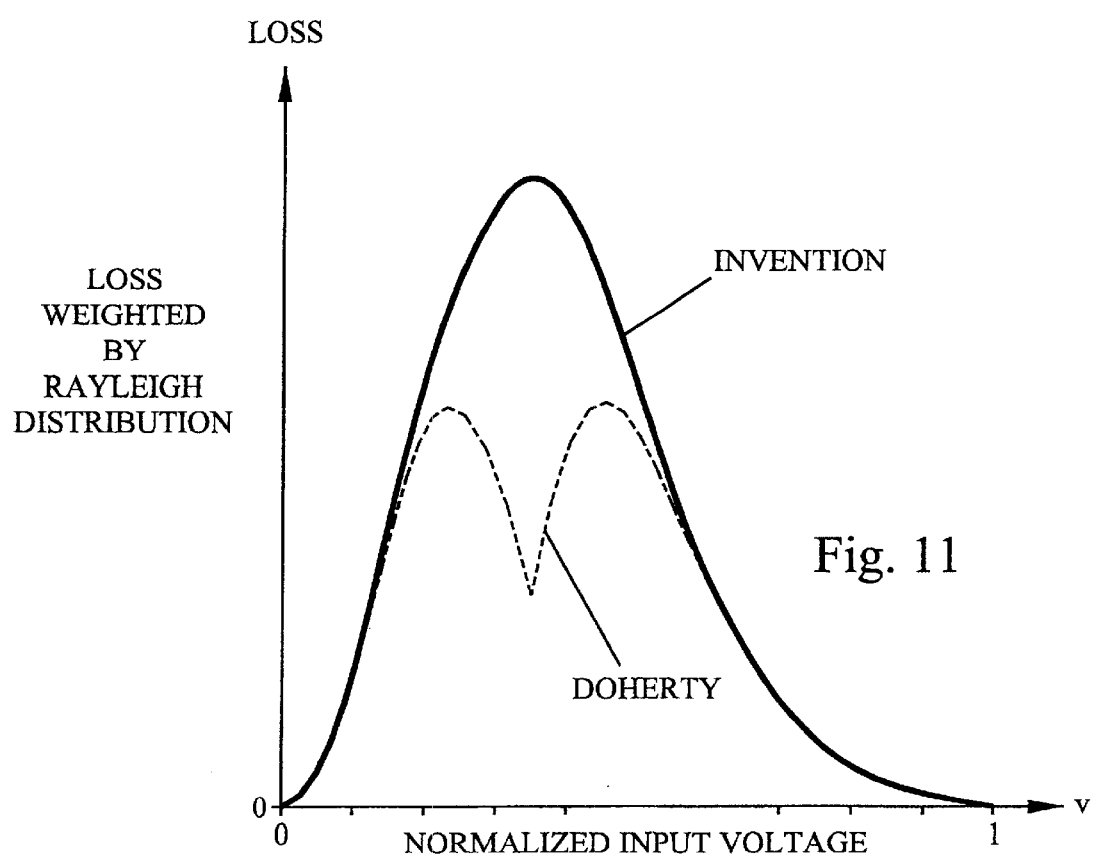
FIG. 11 is a diagram illustrating the power loss of an ideal composite amplifier in accordance with the present invention having the auxiliary amplifier attenuation function of FIG. 7.

The efficiency of an ideal composite amplifier in accordance with the present invention having the auxiliary amplifier attenuation function of FIG. 7 and the efficiency of an ideal Doherty amplifier is illustrated in FIG. 10. The difference in efficiency in a practical system would be even less, since other losses would also contribute and the losses due to mismatch between the main and auxiliary power amplifier would be higher for the Doherty amplifier. The respective losses weighted by the Rayleigh distribution are illustrated in FIG. 11. This loss integrated over the output voltage range is the average loss that is used for calculating the average efficiency of the respective amplifiers.

The average efficiency is calculated as:

$$\eta = \frac{P_{useful}}{P_{useful}+P_{loss}},$$

where all power values are the average (integrated, Rayleigh-weighted) values. Using the curves from FIG. 11, the average efficiencies of the respective amplifiers are:

Doherty: $\eta=60\%$

Invention: $\eta=52\%$

The concepts of an extended transition region and a soft (lower order) transition can be used also in multi-stage implementations, either for all auxiliary amplifiers or only for some auxiliary amplifiers. If not all auxiliary amplifiers are provided with an extended transition region, one possibility is to use this concept for at least one or a few auxiliary amplifiers. Suitable candidates are auxiliary amplifiers that have their transition points at the peak of the Rayleigh distribution.

The supply voltage has in the calculations been assumed to be the same for both amplifiers. This is convenient but not necessary, and by using other impedances for the impedance inverter, the supply voltages can be changed accordingly.

The auxiliary amplifier current function has been assumed, in the examples with polynomial attenuation functions, to go smoothly all the way from zero output power. This is not necessary, and variants of the concept, with the current function being off below a certain point (but below the Doherty transition point) can be considered. This concept can be extended also to the other side of the transition point, giving a "piecewise polynomial" characteristic, with linear sections at the extremes of the curve.

The efficiency of the composite amplifier in accordance with the present invention can be increased by using higher order (but still low order compared to the Doherty) attenuation functions. This implies a tradeoff between bandwidth, distortion and efficiency, that can be useful to have in a practical design situation.

The composite amplifier in accordance with the present invention also offers another important tradeoff possibility. Since the efficiency at peak power is not very important, due to the low values of the Rayleigh distribution in this end, it is possible to deliberately trade efficiency at peak power for a lower order polynomial. The auxiliary amplifier will in this case provide more power at peak power than the power-division ratio would suggest, possibly up to 100%. This tradeoff for less than peak efficiency at peak power can also be made for achieving a higher total efficiency with a certain order of the polynomial. Since this is an important tradeoff, an example of an amplifier with a second-order attenuation function will now be described.

In this example of a bandwidth-optimized implementation, an amplifier with the power division ratio $\alpha=0.39$ will be used. This is close to the optimal value for the Doherty amplifier, giving the Doherty amplifier an efficiency of almost 60%. The composite amplifier in accordance with this embodiment of the present invention uses a second-order attenuation function for generating $i_2$. The corresponding current function is illustrated in FIG. 12. This function is chosen such that at peak power, all the power is delivered by the auxiliary amplifier, and the main amplifier is only contributing current (which is transformed into output voltage by the impedance inverter).

The spectra of the current functions for the respective auxiliary amplifiers in the composite amplifier according to this embodiment of the present invention and the Doherty amplifier are shown in FIG. 13. It is noted that the auxiliary amplifier current spectrum for the composite amplifier of this embodiment of the invention is even narrower (by about ⅗) than for the embodiment described with reference to FIGS. 7–9, and much narrower than for the Doherty amplifier. The efficiency of an ideal composite amplifier in accordance with this embodiment of the invention compared to the efficiency of the ideal Doherty amplifier is illustrated in FIG. 14. It is noted that the efficiency at peak power for the composite amplifier is no longer at the maximum theoretical value of 78.5%. The average efficiencies of the respective amplifiers are the same as in the first example, namely 60% for the Doherty amplifier and 52% for the composite amplifier of the invention. Here the narrower bandwidth comes at the price of having peak power capability in a single (auxiliary) amplifier, instead of splitting it between two amplifiers.

Since all previously described composite amplifiers which use an impedance inverter (output Doherty network) for obtaining a negative load-pulling effect on the main amplifier have had the same characteristics, with completely shut off auxiliary amplifiers below a sharply defined transition point, the amplifiers described in this disclosure represent a new class of composite amplifiers. In these new amplifiers the transition-point parameter $\alpha$ only defines a lower boundary for the choice of current function, and need not even define the power division ratio at peak power.

The new composite amplifiers disclosed in this document offer lower distortion, better cooperation with linearization equipment and narrower band-width of the signals in the impedance inverter than the established Doherty amplifier. At the same time, most of the efficiency of the Doherty amplifier can be retained.

It will be understood by those skilled in the art that various modifications and changes may be made to the present invention without departure from the scope thereof, which is defined by the appended claims.

REFERENCES

[1] F. H. Raab, "Efficiency of Doherty RF Power Amplifier Systems", IEEE Trans. Broadcasting, vol. BC-33, no. 3, pp. 77–83, September 1987.
[2] D. M. Upton et al., U.S. Pat. No. 5,420,541.
[3] J. J. Schuss et al., U.S. Pat. No. 5,568,086.
[4] B. E. Sigmon, U.S. Pat. No. 5,786,727.
[5] Y. Tajima et al., U.S. Pat. No. 5,025,225.
[6] S. R. Cripps, "RF Power Amplifiers for Wireless Communications", Chapter 7, pp. 179–218 and Chapter 8, pp. 225–239, Artech House, 1999.

What is claimed is:

1. A composite amplifier including:
    a main amplifier and an auxiliary amplifier, which are connected to a load over a Doherty output network; and
    means for activating said auxiliary amplifier before said main amplifier is saturated by providing an auxiliary amplifier output current function that depends on the composite amplifier output voltage and has:
        (a) a non-zero auxiliary amplifier output current ($i_2$) below the main amplifier saturation point; and
        (b) a lower slope for non-zero low auxiliary amplifier output currents than for high auxiliary amplifier output currents.

2. The composite amplifier of claim 1, including an attenuator for attenuating the input signal to said auxiliary power amplifier in accordance with a predetermined attenuation function.

3. The composite amplifier of claim 2, wherein said attenuation function is a low order polynomial of said input signal.

4. The composite amplifier of claim 2, wherein said attenuation function is a low order polynomial in the squared magnitude of said input signal.

5. The composite amplifier of claim 2, wherein said attenuator operates in the digital domain.

6. The composite amplifier of claim 5, wherein said attenuator operates at baseband.

7. The composite amplifier of claim 5, wherein said attenuator operates at intermediate frequency.

8. The composite amplifier of claim 5, wherein said attenuator includes a pre-distorter.

9. The composite amplifier of claim 2, wherein said attenuator operates in the analog domain.

10. The composite amplifier of claim 9, wherein said attenuator operates at radio frequency.

\* \* \* \* \*

UNITED STATES PATENT AND TRADEMARK OFFICE
CERTIFICATE OF CORRECTION

PATENT NO. : 6,639,464 B2
DATED : October 28, 2003
INVENTOR(S) : Hellberg, R.

It is certified that error appears in the above-identified patent and that said Letters Patent is hereby corrected as shown below:

<u>Title page,</u>
Item [73], Assignee, please add:
-- Telefonaktiebolaget LM Ericsson (publ), Stockholm (SE) --

Signed and Sealed this

Sixth Day of April, 2004

JON W. DUDAS
*Acting Director of the United States Patent and Trademark Office*